(12) United States Patent
Song

(10) Patent No.: US 11,342,530 B2
(45) Date of Patent: May 24, 2022

(54) TRANSPARENT DISPLAY SUBSTRATE AND MANUFACTURING METHOD THEREOF, TRANSPARENT DISPLAY DEVICE

(71) Applicant: BOE TECHNOLOGY GROUP CO., LTD., Beijing (CN)

(72) Inventor: Yingying Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/859,023

(22) Filed: Apr. 27, 2020

(65) Prior Publication Data

US 2021/0098734 A1    Apr. 1, 2021

(30) Foreign Application Priority Data

Sep. 26, 2019    (CN) .......................... 201910917814.4

(51) Int. Cl.
*H01L 51/52*    (2006.01)
*H01L 27/32*    (2006.01)
(Continued)

(52) U.S. Cl.
CPC ...... *H01L 51/5228* (2013.01); *H01L 27/3246* (2013.01); *H01L 27/3272* (2013.01);
(Continued)

(58) Field of Classification Search
CPC ............. H01L 51/5228; H01L 27/3246; H01L 51/001; H01L 51/0011; H01L 51/0022; H01L 51/5218; H01L 51/5234
(Continued)

(56) References Cited

U.S. PATENT DOCUMENTS 9,093,669 B2    7/2015    Park et al.
9,627,459 B2    4/2017    Yamazaki et al.
(Continued)

FOREIGN PATENT DOCUMENTS

CN    103155706 A    6/2013
CN    104393194 A    3/2015
(Continued)

OTHER PUBLICATIONS

Chinese Office Action in Chinese Application No. 201910917814.4 dated Jul. 13, 2021 with English translation.
(Continued)

*Primary Examiner* — Dzung Tran
(74) *Attorney, Agent, or Firm* — Collard & Roe, P.C.

(57) ABSTRACT

A transparent display substrate, a manufacturing method thereof, and a transparent display device are disclosed. The transparent display substrate includes a base substrate and a pixel defining layer defining a plurality of pixel regions on the base substrate; at least one of the pixel regions includes a light-transmitting portion and a light-emitting portion, and is provided with an OLED layered portion and an auxiliary electrode; the OLED layered portion includes a reflective anode, an organic light-emitting layer and a transmissive cathode; and the auxiliary electrode is located in the light-transmitting portion, disposed at a side of the transmissive cathode close to the base substrate, and connected to the transmissive cathode.

9 Claims, 4 Drawing Sheets

(51) Int. Cl.
*H01L 51/00* (2006.01)
*H01L 51/56* (2006.01)

(52) U.S. Cl.
CPC ........ *H01L 51/001* (2013.01); *H01L 51/0011* (2013.01); *H01L 51/0022* (2013.01); *H01L 51/5218* (2013.01); *H01L 51/5234* (2013.01); *H01L 51/56* (2013.01); *H01L 2227/323* (2013.01); *H01L 2251/5315* (2013.01)

(58) Field of Classification Search
USPC .......................................................... 257/40
See application file for complete search history.

(56) References Cited

U.S. PATENT DOCUMENTS

| | | | |
|---|---|---|---|
| 9,698,367 B2 | 7/2017 | Wang et al. | |
| 9,825,115 B2 | 11/2017 | Yeo et al. | |
| 9,929,369 B2 | 3/2018 | Kim | |
| 10,784,471 B2 | 9/2020 | Fang et al. | |
| 11,005,064 B2 | 5/2021 | Li | |
| 2005/0012454 A1* | 1/2005 | Yamazaki | H01L 51/5234 313/506 |
| 2006/0226396 A1 | 10/2006 | Majumdar et al. | |
| 2008/0164474 A1* | 7/2008 | Yamazaki | H01L 27/3276 257/59 |
| 2009/0046041 A1* | 2/2009 | Tanikame | G09G 3/3233 345/76 |
| 2010/0244664 A1* | 9/2010 | Fujioka | H01L 27/3246 313/504 |
| 2011/0215329 A1 | 9/2011 | Chung | |
| 2011/0241001 A1* | 10/2011 | Omoto | G09G 3/325 257/59 |
| 2014/0239262 A1 | 8/2014 | Kim et al. | |
| 2014/0346459 A1 | 11/2014 | Song et al. | |
| 2016/0240810 A1 | 8/2016 | Oh et al. | |
| 2018/0166518 A1* | 6/2018 | Kim | H01L 51/0508 |

FOREIGN PATENT DOCUMENTS

| | | |
|---|---|---|
| CN | 104885251 A | 9/2015 |
| CN | 105140408 A | 12/2015 |
| CN | 105428548 A | 3/2016 |
| CN | 106328676 A | 1/2017 |
| CN | 107681062 A | 2/2018 |
| CN | 107731883 A | 2/2018 |
| CN | 108417738 A | 8/2018 |
| CN | 108899348 A | 11/2018 |
| CN | 109524443 A | 3/2019 |
| CN | 110137365 A | 8/2019 |
| KR | 10-2012-0044876 A | 5/2012 |
| SG | 126714 A1 | 11/2006 |
| TW | 201230322 A | 7/2012 |

OTHER PUBLICATIONS

Second Chinese Office Action in Chinese Application No. 201910917814.4 dated Feb. 21, 2022 with English translation.

* cited by examiner

TRANSPARENT DISPLAY SUBSTRATE AND MANUFACTURING METHOD THEREOF, TRANSPARENT DISPLAY DEVICE

CROSS REFERENCE TO RELATED APPLICATIONS

Applicant claims priority under 35 U.S.C. § 119 of Chinese Application No. 201910917814.4 filed on Sep. 26, 2019, the disclosure of which is incorporated by reference.

TECHNICAL FIELD

Embodiments of the present disclosure relate to a transparent display substrate, a manufacturing method thereof, and a transparent display device.

BACKGROUND

As brand-new display technology, transparent display allows an observer to see a background behind a display screen through the display screen. By broadening an application range of display devices with such innovative display effect, the transparent display technology has gained extensive attentions. It's known that both reflective liquid crystal display (LCD) substrate and organic light-emitting diode (OLED) display substrate can realize the transparent display, and the OLED display substrate effects better. OLED display substrate can be classified into bottom-emission OLED, top-emission OLED and double-sided-emission OLED, in which the top-emission OLED can effectively improve an aperture ratio of the OLED display substrate.

SUMMARY

Embodiments of the present disclosure provide a transparent display substrate, a manufacturing method thereof, and a transparent display device, which can reduce a resistance of a cathode in the transparent display substrate, and enable uniform voltage distribution in various pixel regions. In this way, it not only improves the uniformness of display brightness of the transparent display substrate but also reduces a power consumption.

On the first aspect, an embodiment of the present disclosure provides a transparent display substrate, including a base substrate and a pixel defining layer on the base substrate, the pixel defining layer defining a plurality of pixel regions, wherein at least one of the plurality of pixel regions includes a light-transmitting portion and a light-emitting portion, and the at least one of the plurality of pixel regions is provided with an OLED layered portion and an auxiliary electrode; the OLED layered portion includes a reflective anode, an organic light-emitting layer and a transmissive cathode; and the auxiliary electrode is located in the light-transmitting portion, disposed at a side of the transmissive cathode close to the base substrate, and connected to the transmissive cathode.

Optionally, in the at least one of the plurality of pixel regions, the pixel defining layer further defines a first opening and a second opening, the first opening is located in the light-emitting portion while the second opening is located in the light-transmitting portion; the reflective anode is located in the light-emitting portion, the organic light-emitting layer is disposed in the first opening, the auxiliary electrode is disposed in the second opening, and the transmissive cathode completely covers the pixel region.

Optionally, the at least one of the plurality of pixel regions is further provided with a dielectric layer; the dielectric layer is disposed in the second opening, and is located at a side of the auxiliary electrode close to the base substrate.

Optionally, the dielectric layer and the organic light-emitting layer are formed by a same process from a same material.

Optionally, a ratio of the light-transmitting portion occupied in the pixel region is substantially equal to a ratio of the light-emitting portion occupied in the pixel region.

Optionally, the plurality of pixel regions are arranged in an array along a row direction and a column direction, and second openings of all the pixel regions located in a same row or a same column are communicated with each other to form a channel extending in the row direction or the column direction.

Optionally, a sum of a thickness of the dielectric layer and a thickness of the auxiliary electrode is smaller than a depth of the second opening.

Optionally, a material of forming the auxiliary material includes ionic liquid; the ionic liquid includes at least one selected from the group consisted of quaternary ammonium salt ionic liquid, nitrogen-containing heterocyclic ionic liquid and pyridinium ionic liquid.

Optionally, a carbon chain length of a positive ion in the ionic liquid is equal to 10.

Optionally, the nitrogen-containing heterocyclic ionic liquid includes imidazole ionic liquid.

Optionally, the transparent display substrate according to claim 1, wherein a thickness of the auxiliary electrode is in a range of about 0.3 μm-about 1 μm.

On the second aspect, an embodiment of the present disclosure further provides a transparent display device, including any of the transparent display substrates described above.

On the third aspect, an embodiment of the present disclosure further provides a manufacturing method of a transparent display substrate, including: providing a base substrate; forming a reflective anode on the base substrate; forming a pixel defining layer defining a plurality of pixel regions on the base substrate formed with the reflective anode, at least one of the plurality of pixel regions including a light-transmitting portion and a light-emitting portion; and forming an organic light-emitting layer in the light-emitting portion, forming an auxiliary electrode in the light-transmitting portion, and forming a transmissive cathode at a side of the auxiliary electrode away from the base substrate and connecting the auxiliary electrode to the transmissive cathode.

Optionally, in the at least one of the plurality of pixel regions, the pixel defining layer further defines a first opening and a second opening, the first opening is located in the light-emitting portion while the second opening is located in the light-transmitting portion; the forming an organic light-emitting layer in the light-emitting portion, forming an auxiliary electrode in the light-transmitting portion, and forming a transmissive cathode at a side of the auxiliary electrode away from the base substrate and connecting the auxiliary electrode to the transmissive cathode includes: for the at least one of the plurality of pixel regions, forming the organic light-emitting layer in the first opening; forming the auxiliary electrode in the second opening; and forming the transmissive cathode on the auxiliary electrode to completely cover the pixel region.

Optionally, the forming the organic light-emitting layer in the first opening includes: forming the organic light-emitting layer in the first opening by evaporation through an opened mask.

Optionally, the forming the auxiliary electrode in the second opening includes: printing a specified solution in the second opening by an ink-printing process; and drying the specified solution to form the auxiliary electrode.

Optionally, a solute of the specified solution includes ionic liquid, and a solvent of the specified solution includes organic solvent; and the organic solvent includes alcohols solvent or ether solvent.

Optionally, the forming the transmissive cathode on the auxiliary electrode includes: forming the transmissive cathode on the auxiliary electrode by a sputtering process, an evaporating process or an ink-printing process from a transparent conductive material.

Optionally, before the forming the auxiliary electrode in the second opening, the manufacturing method further includes: forming the organic light-emitting layer in the first opening and forming a dielectric layer in the second opening, simultaneously, from a same material, in a same process.

Optionally, a sum of a thickness of the dielectric layer and a thickness of the auxiliary electrode is smaller than a depth of the second opening.

BRIEF DESCRIPTION OF THE DRAWINGS

In order to more clearly illustrate the technical solution(s) of the embodiments of the present disclosure, the drawings of the embodiments will be briefly described in the following. It is obvious that the described drawings are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Inventor(s) of the present application found in the researches that, a cathode of the top-emission OLED has a large resistance, and a notable voltage drop would be generated when current flows through the cathode, which causes ununiform voltage distribution at different positions of the cathode, resulting in ununiform brightness and higher power consumption of the OLED display substrate when performing transparent display.

Figure 1:
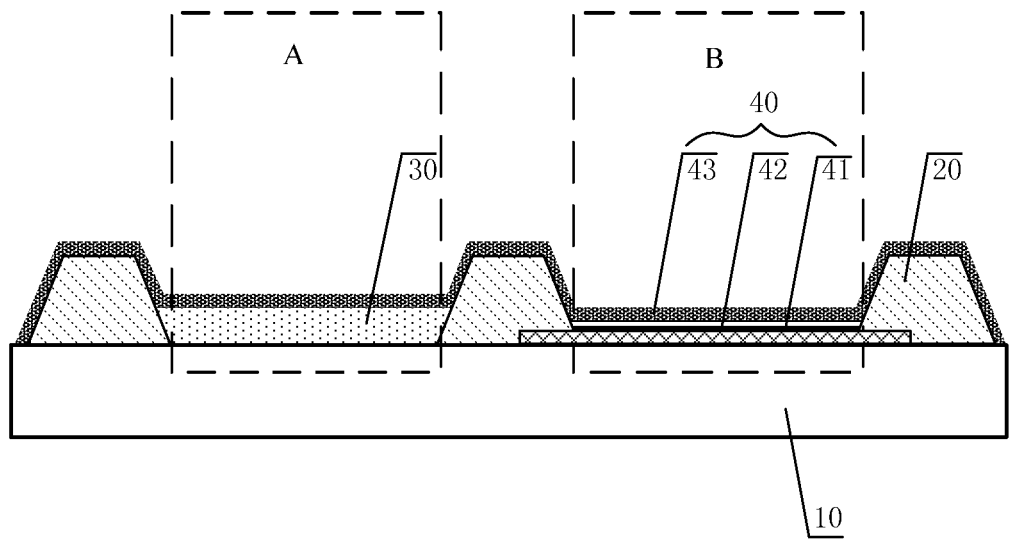
FIG. 1 is a structural diagram of a transparent display substrate provided by an embodiment of the present disclosure.

At least one embodiment of the present disclosure provides a transparent display substrate. FIG. 1 is a structural diagram of a transparent display substrate provided by an embodiment of the present disclosure. As illustrated in FIG. 1, the transparent display substrate provided by the embodiment of the present disclosure may include: a base substrate 10 and a pixel defining layer 20 disposed on the base substrate 10, the pixel defining layer 20 is configured to define a plurality of pixel regions; at least one of the plurality of pixel regions includes a light-transmitting portion A and a light-emitting portion B, and is provided with an auxiliary electrode 30 and an OLED layered portion 40; the OLED layered portion 40 includes a reflective anode 41, an organic light-emitting layer 42 and a transmissive cathode 43; the auxiliary electrode 30 is located in the light-transmitting portion A, disposed at a side of the transmissive cathode 43 close to the base substrate 10, and connected to the transmissive cathode 43.

Optionally, the base substrate 10 may be a rigid base substrate or a flexible base substrate. For example, a material of the rigid base substrate may be, but not limited to, one or more of glass and metal foil; a material of the flexible base substrate may be, but not limited to, one or more selected from the group consisted of polyethylene terephthalate (PET), bis(2-hydroxyethyl) terephthalate (BHET), polyether-ether-ketone (PEEK), polystyrene (PS), polycarbonate, Polyarylate (PAR), Polyarylester, polyimide, polyvinyl chloride, polyethylene (PE) and textile fiber.

Optionally, the plurality of pixel regions may be arranged in an array along a row direction and a column direction or arranged in a Pentile mode, without particularly limited in the embodiments of the present disclosure. It should be explained that, although the pixel regions illustrated in the drawings are arranged in an array along the row direction and the column direction, the embodiments of the present disclosure are not limited thereto.

Optionally, the light-emitting portion B of the transparent display substrate is configured to emit light, while the light-transmitting portion A is configured to transmit light emitted by the OLED layered portion 40.

Optionally, in the embodiment of the present disclosure, the OLED layered portion 40 is a top-emission OLED component.

Optionally, the transparent display substrate provided by the embodiment of the present disclosure further includes: a thin film transistor (TFT), a passivation layer and a planarization layer (not illustrated) sequentially disposed at a side of the base substrate close to the pixel defining layer. A drain electrode of the TFT is electrically connected to the reflective anode of the OLED layered portion through a via hole provided in the passivation layer and the planarization layer.

In the present embodiment, the arrangement of the planarization layer ensures uniform light emitted from the OLED layered portion.

In the embodiment of the present disclosure, in order not to affect the transparent display effect of the transparent display substrate, an orthographic projection of the light-transmitting portion on the base substrate has no overlap with orthographic protections of a gate electrode, the drain electrode and a source electrode of the TFT on the base substrate.

The type of the TFT is not particularly limited in the embodiment of the present disclosure. For example, the TFT may be a monocrystalline silicon TFT, a low temperature polycrystalline silicon TFT or an oxide TFT. Usually, in order to satisfy the requirements on a driving current of the TFT, a channel ratio (a ratio of a width of a channel layer to a length of the channel layer) of the monocrystalline silicon TFT is greater than 6, a channel ratio of the oxide TFT is greater than 2, and a channel ratio of the low temperature polycrystalline silicon TFT is greater than 0.5. Therefore, in an example, in order to reduce a size of the TFT, the low temperature polycrystalline silicon TFT may be adopted, so that the size of the TFT may be made smaller and a ratio of the light-emitting portion occupied in the pixel region is decreased, which facilitates to improve the transparent display effect of the transparent display substrate. Moreover, when the TFT is made smaller, so will be the pixel unit, which also facilitates to improve a resolution of the transparent display panel.

Optionally, the transparent display substrate provided by the embodiment of the present disclosure further includes a light-shielding layer disposed between the base substrate 10 and the TFT. A material of forming the light-shielding layer is not particularly limited in the embodiment of the present disclosure, as long as it enables to shield the light. For example, the light-shielding layer may be a metallic layer. The light-shielding layer is capable of protecting the TFT against any damage due to light irradiation, so that a carrier concentration in the TFT remains stable.

Optionally, the transparent display substrate provided by the embodiment of the present disclosure further includes a buffer layer disposed between the light-shielding layer and the TFT, so as to prevent the quality of the transparent display substrate from being affected by any defection of the base substrate.

Optionally, a material of forming the reflective anode 41 may be a metal, for example, Cu, Al and the like, without particularly limited in the embodiment of the present disclosure.

Optionally, the organic light-emitting layer 42 may include a light-emitting material layer, and may also include at least one of an electron transporting layer, an electron injecting layer, a hole transporting layer or a hole injecting layer, without particularly limited in the embodiment of the present disclosure.

Optionally, a material of forming the transmissive cathode 43 may be a transparent conductive material, for example, indium tin oxide (ITO), zinc tin oxide (ZnSnO) and the like, without particularly limited in the embodiment of the present disclosure.

As above, the transparent display substrate provided by the embodiment of the present disclosure includes a base substrate and a pixel defining layer disposed on the base substrate to define a plurality of pixel regions; at least one of the pixel regions includes a light-transmitting portion and a light-emitting portion, and is provided with an OLED layered portion and an auxiliary electrode; the OLED layered portion includes a reflective anode, an organic light-emitting layer and a transmissive cathode; the auxiliary electrode is disposed in the light-transmitting portion, and is connected to the transmissive cathode. In the embodiment of the present disclosure, the arrangement of the auxiliary electrode that is disposed in the light-transmitting portion of the pixel region and connected to the transmissive cathode of the OLED layered portion is equivalent to connecting a resistor to the transmissive cathode in parallel, which enables to reduce the resistance of the cathode in the transparent display substrate, and to achieve an uniform voltage distribution in various pixel regions. In this way, it not only improves the uniformity of display brightness of the transparent display substrate, but also reduces the power consumption, thereby extending a service life of the transparent display substrate.

Optionally, in at least one of the pixel regions, a ratio of the light-transmitting portion occupied in the pixel region is substantially equal to a ratio of the light-emitting portion occupied in the pixel region.

Optionally, as illustrated in FIG. 1, the pixel defining layer 20 is further configured to define a first opening K1 and a second opening K2 in at least one of the pixel regions. The first opening K1 is located in the light-emitting portion B while the second opening K2 is located in the light-transmitting portion A. The reflective anode 41 is disposed in the light-emitting portion and has a range greater than that of the first opening K1; the organic light-emitting layer 42 is disposed in the first opening K1, while the auxiliary electrode 30 is disposed in the second opening K2, and the transmissive cathode 43 completely covers the pixel region.

Figure 2:
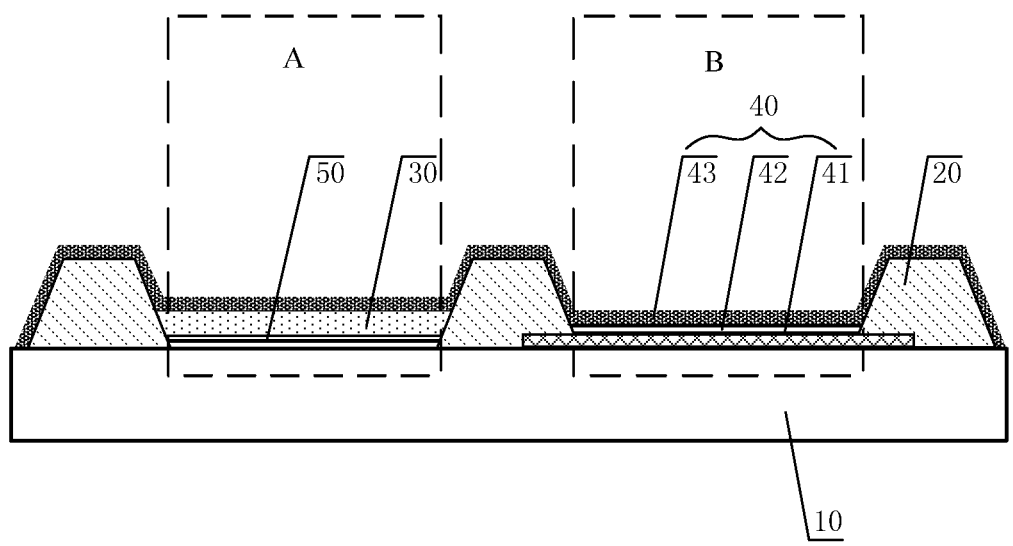
FIG. 2 is another structural diagram of a transparent display substrate provided by an embodiment of the present disclosure.

FIG. 2 is another structural diagram of a transparent display substrate provided by an embodiment of the present disclosure, in which the transparent display substrate is a large-sized substrate. As illustrated in FIG. 2, in the transparent display substrate provided by the present embodiment, at least one of the pixel regions is further provided with a dielectric layer 50. The dielectric layer 50 is disposed in the second opening K2, and is located at a side of the auxiliary electrode 30 close to the base substrate 10. It should be explained that, in the case where the transparent display substrate is a small-sized substrate, the dielectric layer 50 may be omitted.

Optionally, in the present embodiment, the dielectric layer 50 and the organic light-emitting layer 42 may be made from a same material and simultaneously formed in a same process.

Optionally, a sum of a thickness of the dielectric layer and a thickness of the auxiliary electrode is smaller than a depth of the second opening. According to the embodiment of the present disclosure, when a total thickness of film(s) or layer(s) (e.g., the above-described dielectric layer and the auxiliary electrode) in the light-transmitting portion is small, a transparence of the light-transmitting portion is increased and the display effect of the transparent display panel is improved.

It should be explained that, the terms "thickness" and "depth" as used in the embodiments of the present disclosure both refer to a size in a direction perpendicular to the base substrate.

Figure 3:
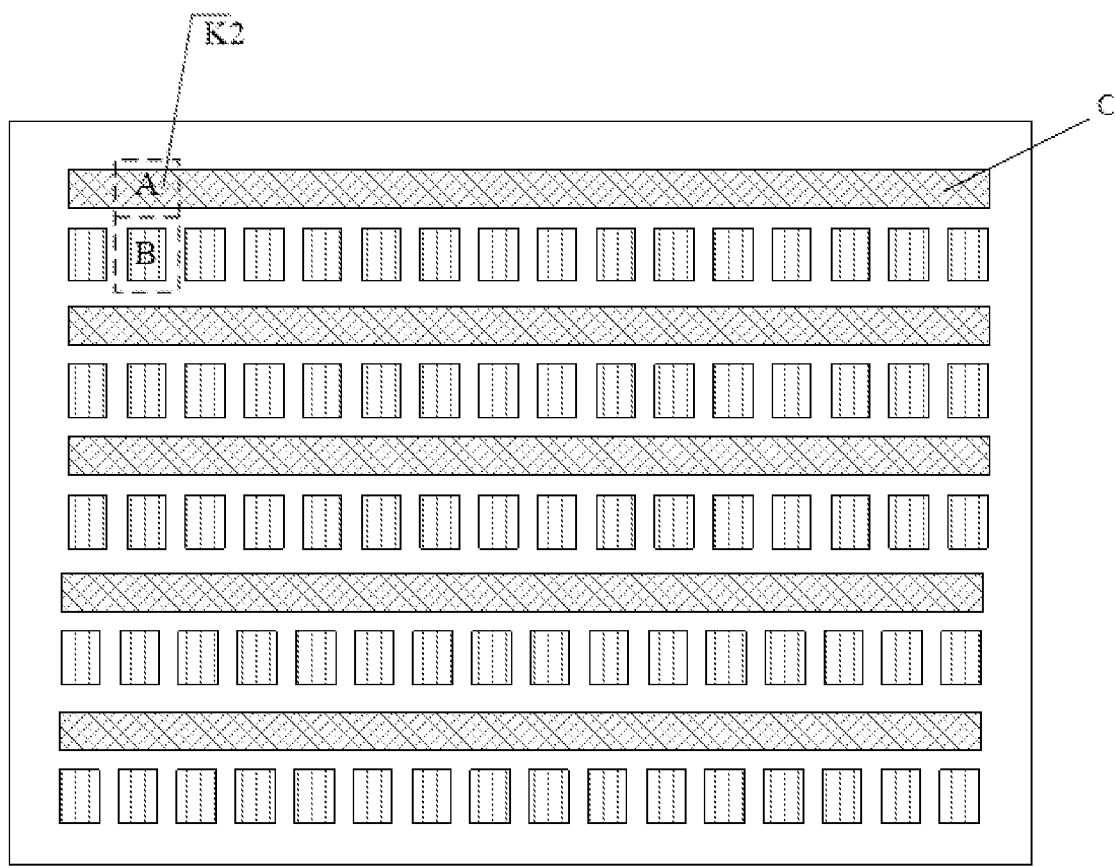
FIG. 3 is a top view of a transparent display substrate provided by an embodiment of the present disclosure.

FIG. 3 is a top view of a transparent display substrate provided by an embodiment of the present disclosure. As illustrated in FIG. 3, the plurality of pixel regions are arranged in an array along the row direction and the column direction, and second openings of all the pixel regions in a same row or a same column are communicated with each other. In FIG. 3, the pixel region is illustrated as a dashed box, including a light-transmitting portion A and a light-emitting portion B, with the second opening K2 being located in the light-transmitting portion A. It should be explained that, although FIG. 3 illustrates the case where the second openings K2 of all the pixel regions arranged in a same row are communicated with each other, the embodiment of the present disclosure is not limited thereto. For example, it's also possible that the second openings K2 of all the pixel regions arranged in a same column are communicated with each other.

In the present embodiment, the second openings K2 of all the pixel regions arranged in a same row or a same column are communicated with each other; that is to say, the second openings K2 of all the pixel regions arranged in a same row or a same column, as a whole, are formed into a strip-like channel C, which facilitates to manufacture the light-transmitting portions in the pixel regions. Correspondingly, in the present embodiment, the transparent display substrate includes a plurality of channels C, and the number of the channels C is correlated to the number of the rows or columns of the pixel regions, without particularly limited in the embodiment of the present disclosure. It should be explained that, although FIG. 3 illustrates the case where the second openings K2 of all the pixel regions arranged in a same row are communicated with each other to form a channel C extending along the row direction, the embodiment of the present disclosure is not limited thereto. For example, it's also possible that the second openings K2 of all the pixel regions arranged in a same column are communicated with each other to form a channel C extending along the column direction.

Optionally, in the present embodiment, a material of forming the auxiliary electrode 30 may include ionic liquid; the ionic liquid may include at least one selected from the group consisted of quaternary ammonium salt ionic liquid, nitrogen-containing heterocyclic ionic liquid and pyridinium ionic liquid.

Optionally, a carbon chain length of a positive ion in the ionic liquid is equal to 10.

Optionally, the nitrogen-containing heterocyclic ionic liquid includes imidazole ionic liquid.

In the present embodiment, because the ionic liquid has excellent conductivity, it enables to well relief the voltage drop resulted by the large resistance of the cathode, thereby mitigating the issue of ununiform brightness in the transparent display substrate attributed to the voltage drop.

Optionally, in order to guarantee the transparent display effect of the transparent display substrate, a thickness of the auxiliary electrode in the present embodiment may be in a range of about 0.3 μm-about 1 μm.

Optionally, the transparent display substrate provided by the embodiment of the present disclosure further includes a packaging layer disposed at a side of the transmissive cathode away from the base substrate. The packaging layer in the present embodiment not only isolates the light-emitting component from outside, but also prevents moisture and oxygen from invading into the organic light-emitting layer to affect the service life of the transparent display substrate; at the same time, the packaging layer has a flat surface, so that other film layer(s) facilitating the display effect of the transparent display substrate may be further disposed on the transparent display substrate.

Figure 4:
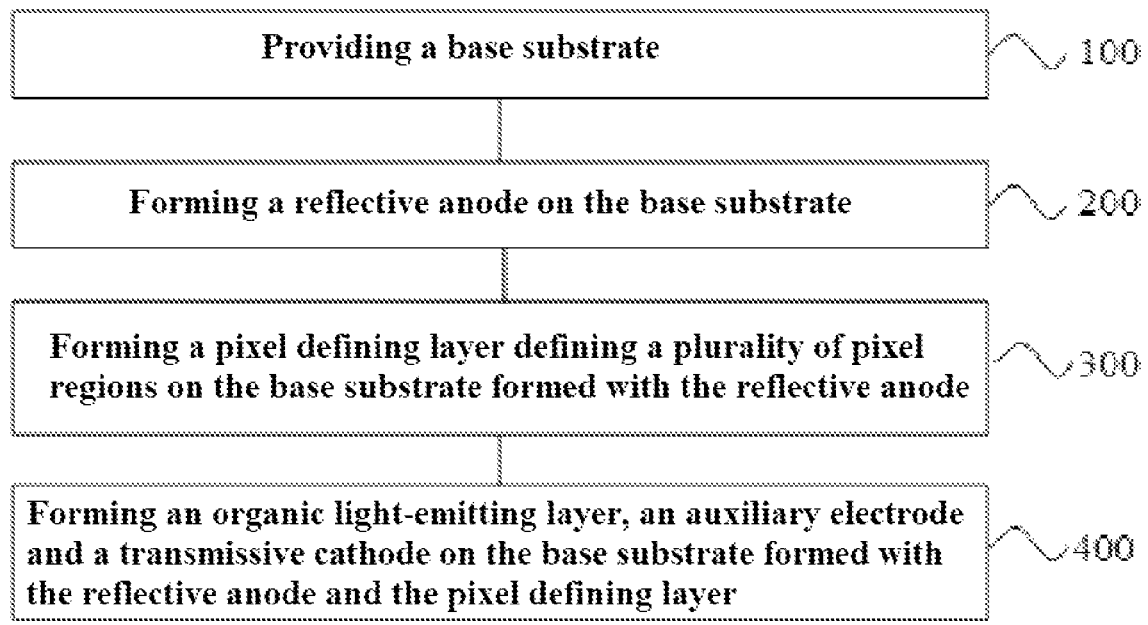
FIG. 4 is a flow chart of a manufacturing method of a transparent display substrate provided by an embodiment of the present disclosure.

Based on the same inventive concept, an embodiment of the present disclosure further provides a manufacturing method of a transparent display substrate. FIG. 4 is a flow chart of a manufacturing method of a transparent display substrate provided by an embodiment of the present disclosure. As illustrated in FIG. 4, the manufacturing method provided by the embodiment of the present disclosure may include the following steps 100-400.

Step S100, providing a base substrate.

Optionally, the base substrate 10 may be a rigid base substrate or a flexible base substrate. For example, a material of the rigid base substrate may be, but not limited to, one or more of glass and metal foil; a material of the flexible base substrate may be, but not limited to, one or more selected from the group consisted of polyethylene terephthalate (PET), bis(2-hydroxyethyl) terephthalate (BHET), polyether-ether-ketone (PEEK), polystyrene (PS), polycarbonate, Polyarylate (PAR), Polyarylester, polyimide, polyvinyl chloride, polyethylene (PE) and textile fiber.

It should be explained that, if the base substrate 10 in this step is a flexible base substrate, the flexible base substrate 10 may be firstly attached onto a rigid substrate, for example, a glass substrate, and then other structures such as the OLED layered portion may be formed on the flexible base substrate 10; moreover, after the manufacture of the transparent display substrate is finished, the base substrate 10 on which other structures such as the OLED layered portion have been formed may be stripped from the rigid substrate; in this way, a flexible transparent display substrate is obtained.

Step S200, forming a reflective anode on the base substrate.

Optionally, the step S200 includes: forming the reflective anode on the base substrate by a sputtering process, an evaporating process or an ink-printing process.

Step S300, forming a pixel defining layer defining a plurality of pixel regions on the base substrate formed with the reflective anode.

Optionally, the step S300 includes: forming the pixel defining layer on the base substrate by a patterning process. A patterning process includes steps of photoresist coating, exposing, developing, etching, peeling and the like. A material of forming the pixel defining layer is not particularly limited in the embodiment of the present disclosure, but may be any materials known in the art selected by those ordinary skilled in the art according to actual demands.

Optionally, the plurality of pixel regions may be arranged in an array along a row direction and a column direction or arranged in Pentile mode, without particularly limited in the embodiment of the present disclosure.

In the embodiment of the present disclosure, at least one of the pixel regions includes a light-transmitting portion A configured to transmit light and a light-emitting portion B configured to emit light. Optionally, in at least one of the pixel regions, a ratio of the light-transmitting portion occupied in the pixel region is substantially equal to a ratio of the light-emitting portion occupied in the pixel region.

Step S400, forming an organic light-emitting layer, an auxiliary electrode and a transmissive cathode on the base substrate formed with the reflective anode and the pixel defining layer.

In the embodiment of the present disclosure, the auxiliary electrode is formed in the light-transmitting portion, the transmissive cathode is formed at a side of the auxiliary electrode away from the base substrate and is connected to the auxiliary electrode.

Optionally, in the present embodiment, the OLED layered portion is a top-emission OLED component. Optionally, a material of forming the reflective anode may be a metal, for example, Cu, Al and the like; the organic light-emitting layer may include a light-emitting material layer, and may also include at least one of an electron transporting layer, an electron injecting layer, a hole transporting layer or a hole injecting layer; a material of forming the transmissive cathode may be a transparent conductive material, for example, indium tin oxide (ITO), zinc tin oxide (ZnSnO) and the like; all the above are not particularly limited in the embodiment of the present disclosure.

Optionally, before step S200, the manufacturing method provided by the embodiment of the present disclosure further includes step S000: forming a thin film transistor (TFT), a passivation layer and a planarization layer, sequentially, on the base substrate. In such case, the step S200 may include: forming the reflective anode on the planarization layer; the step S300 may include: forming the pixel defining layer configured to define the plurality of pixel regions, on the planarization layer and on the reflective anode.

Optionally, a drain electrode of the TFT is electrically connected to the reflective anode of the OLED layered portion through a via hole provided in the passivation layer and the planarization layer. Optionally, in order not to affect the transparent display effect of the transparent display substrate, an orthographic projection of the light-transmitting portion on the base substrate has no overlap with orthographic projections of a gate electrode, the drain electrode and a source electrode of the TFT on the base substrate.

As above, the manufacturing method of the transparent display substrate provided by the embodiment of the present disclosure includes: providing a base substrate; forming a reflective anode on the base substrate; forming a pixel defining layer defining a plurality of pixel regions on the base substrate formed with the reflective anode, wherein at least one of the pixel regions includes a light-transmitting portion and a light-emitting portion; forming an organic light-emitting layer in the light-emitting portion, forming an auxiliary electrode in the light-transmitting portion, and forming a transmissive cathode at a side of the auxiliary electrode away from the base substrate and connecting the auxiliary electrode to the transmissive cathode. In the embodiment of the present disclosure, the arrangement of the auxiliary electrode that is disposed in the light-transmitting portion of the pixel region and connected to the transmissive cathode of the OLED layered portion is equivalent to connecting a resistor to the transmissive cathode in parallel, which enables to reduce the resistance of the cathode in the transparent display substrate, and to achieve an uniform voltage distribution in various pixel regions. In this way, it not only improves the uniformity of display brightness of the transparent display substrate, but also reduces the power consumption, thereby extending a service life of the transparent display substrate.

Optionally, the pixel defining layer is further configured to define a first opening K1 and a second opening K2 in at least one of the pixel regions. The first opening K1 is located in the light-emitting portion B while the second opening K2 is located in the light-transmitting portion A. In such case, the step S400 may include the following sub-steps S410-S430.

Step S410, forming the organic light-emitting layer in the first opening.

For example, the step S410 may include: forming the organic light-emitting layer in the first opening and on the reflective anode by evaporation through an opened mask.

Step S420, forming the auxiliary electrode in the second opening.

For example, the step S420 may include: printing a specified solution in the second opening by an ink-printing process; and drying the specified solution to form the auxiliary electrode.

Optionally, a solute of the specified solution is ionic liquid, and a solvent of the specified solution is organic solvent.

Optionally, the organic solvent includes alcohols solvent or ether solvent.

Step S430, forming the transmissive cathode on the auxiliary electrode to completely cover the pixel region.

For example, the step S430 may include: forming the transmissive cathode on the auxiliary electrode by a sputtering process, an evaporating process or an ink-printing process from a transparent conductive material.

Optionally, when the transparent display substrate is applied in a large-sized display product, the manufacturing method provided by the embodiment of the present disclosure may further include: before the step S420, forming a dielectric layer in the second opening.

For example, the dielectric layer and the organic light-emitting layer may be made from a same material and simultaneously formed in a same process. For example, a sum of a thickness of the dielectric layer and a thickness of the auxiliary electrode is smaller than a depth of the second opening, so as to increase the transparence of the light-transmitting portion and improve the display effect of the transparent display panel.

Hereinafter, the manufacturing method of the transparent display substrate provided by the embodiment of the present disclosure is described with reference to the case of large-sized transparent display substrate, in conjunction with FIGS. 5A-5E.

Figure 5A:
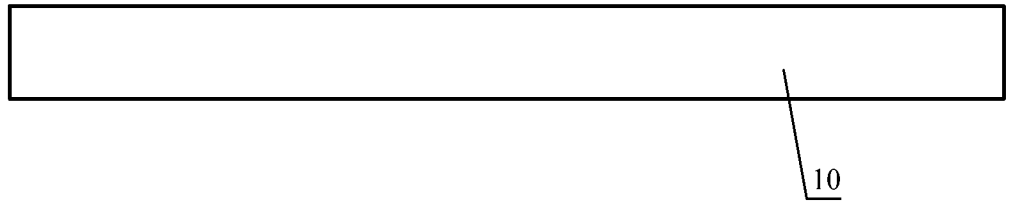
FIG. 5A is a first schematic view of a manufacturing method of a transparent display substrate provided by an embodiment of the present disclosure.

Step S101, providing a base substrate 10, and sequentially forming a thin film transistor (TFT), a passivation layer and a planarization (not illustrated) on the base substrate, as illustrated in FIG. 5A.

Figure 5B:
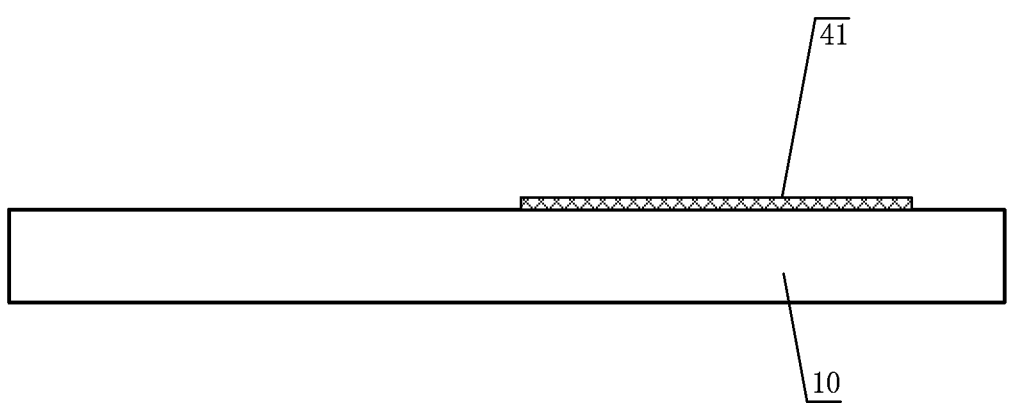
FIG. 5B is a second schematic view of a manufacturing method of a transparent display substrate provided by an embodiment of the present disclosure.

Step S102, forming a reflective anode 41 on the base substrate 10, as illustrated in FIG. 5B.

Figure 5C:
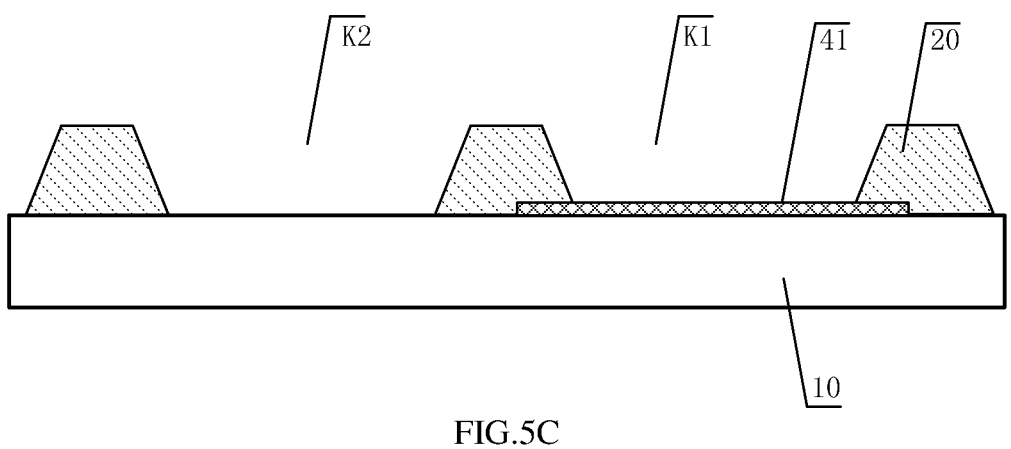
FIG. 5C is a third schematic view of a manufacturing method of a transparent display substrate provided by an embodiment of the present disclosure.

Step S103, forming a pixel defining layer 20 configured to define a plurality of pixel regions, on the base substrate 10, as illustrated in FIG. 5C.

In the present embodiment, at least one of the pixel regions includes a light-emitting portion B and a light-transmitting portion A. Optionally, in each of the pixel regions, the pixel defining layer 20 may further define a first opening K1 located in the light-emitting portion B and a second opening K2 located in the light-transmitting portion A.

Figure 5D:
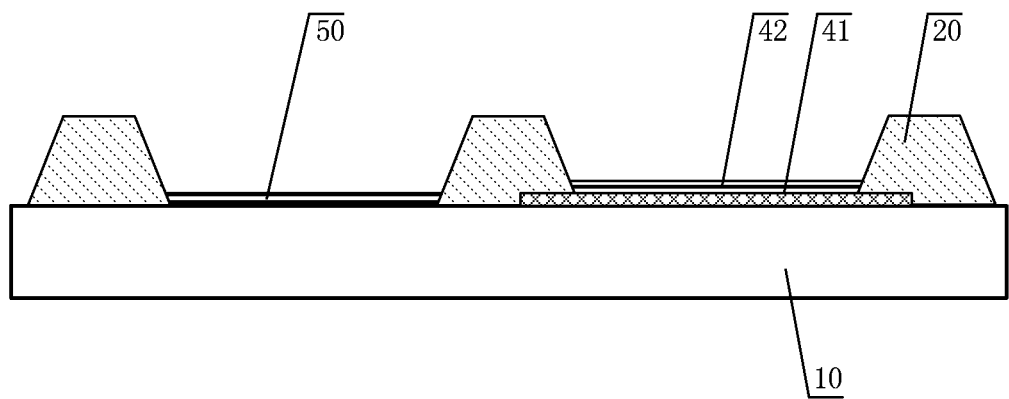
FIG. 5D is a fourth schematic view of a manufacturing method of a transparent display substrate provided by an embodiment of the present disclosure.

Step S104, forming an organic light-emitting layer 42 in the first opening K1 and forming a dielectric layer 50 in the second opening K2, simultaneously, from a same material in a same process, as illustrated in FIG. 5D.

Figure 5E:
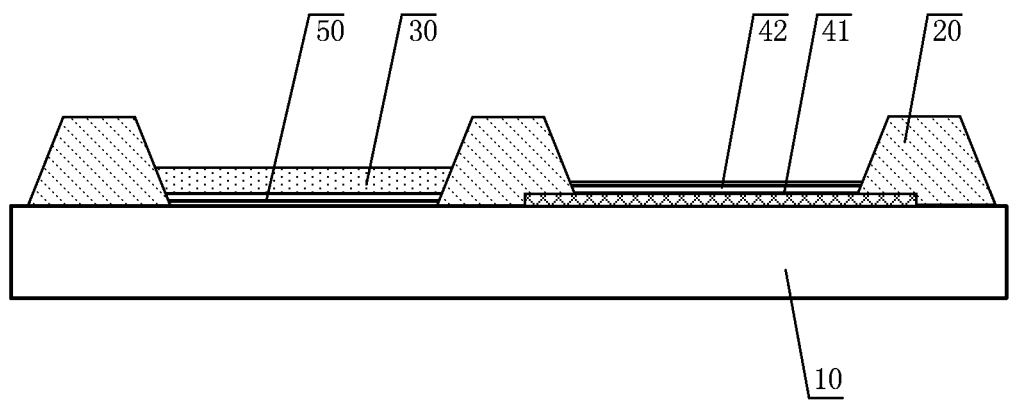
FIG. 5E is a fifth schematic view of a manufacturing method of a transparent display substrate provided by an embodiment of the present disclosure.

Step S105, forming an auxiliary electrode 30 in the second opening K2, as illustrated in FIG. 5E.

Step S106, forming a transmissive cathode 43 on the auxiliary electrode 30 to completely cover the pixel region, as illustrated in FIG. 2.

The flows and processes involved in steps S101-S106 of the present embodiment may be referred to the related description in steps S100-S400 and S410-S430 above, without repetitively described here. The flows and processes omitted in the present embodiment may be referred to technologies known for those ordinary skilled in the art, without particularly limited here.

Based on the same inventive concept, an embodiment of the present disclosure further provides a transparent display device including the transparent display substrate described in any of the embodiments above.

Optionally, the transparent display device provided by the embodiment of the present disclosure may be any device which displays mobile image (e.g., video) or stationary image (e.g., still image), including text and picture. For example, these embodiments may be expected to be implemented in various types of electronic devices or be correlated thereto, for example (not limited to), mobile phone, wireless device, digital data assistance (PDA), handheld or portable computer, GPS receiver/transmitter, camera, MP4 video player, game console, watch, clock, calculator, television monitor, tablet computer, computer monitor, vehicle display (e.g., odometer display), navigator, cabin controller/display, camera display (e.g., a display of a rear-view camera in a vehicle), digital photo, electronic billboard or indicator, projector, building structure, package, aesthetic structure (e.g., a display for an image of a jewelry) and the like, which are not particularly limited in the embodiment of the present disclosure.

The transparent display substrate in the present embodiment may be the transparent display substrate described in any of the foregoing embodiments. Exemplary structures, principles and technical effects of the transparent display device provided by the embodiment of the present disclosure may be referred to the related description in the foregoing embodiments, without repetitively described here.

For purpose of clarity, in the drawings describing the embodiments of the present disclosure, the thickness and size of the layer or microstructure may be exaggerated. It should be understood that, when an element such as a layer, film, region or substrate is refereed as located "on" or "beneath" another element, it may be "directly" located "on" or "beneath" another element, or an intermediate element may be existed.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What are described above is specific embodiments of the present disclosure only and not limitative to the scope of the present disclosure; any of those skilled in related arts can easily conceive variations and substitutions in the technical scopes disclosed by the present disclosure, which should be encompassed in protection scopes of the disclosure. Therefore, the scopes of the disclosure should be defined in the appended claims.

The application claims priority of the Chinese patent application No. 201910917814.4, filed on Sep. 26, 2019, the entire disclosure of which is incorporated herein by reference as part of embodiments of the present application.

The invention claimed is:

1. A transparent display substrate, comprising a base substrate and a pixel defining layer on the base substrate, the pixel defining layer defining a plurality of pixel regions, wherein
    at least one of the plurality of pixel regions comprises a light-transmitting portion and a light-emitting portion, and the at least one of the plurality of pixel regions is provided with an OLED layered portion and an auxiliary electrode;
    the OLED layered portion comprises a reflective anode, an organic light-emitting layer and a transmissive cathode; and
    the auxiliary electrode is located in the light-transmitting portion, disposed at a side of the transmissive cathode close to the base substrate, and connected to the transmissive cathode, wherein
    in the at least one of the plurality of pixel regions, the pixel defining layer further defines a first opening and a second opening, the first opening is located in the light-emitting portion while the second opening is located in the light-transmitting portion,
    the auxiliary electrode is disposed in the second opening,
    the at least one of the plurality of pixel regions is further provided with a dielectric layer, the dielectric layer is disposed in the second opening, and is located at a side of the auxiliary electrode close to the base substrate, an orthographic projection of the dielectric layer on the base substrate is located within an orthographic projection of the second opening on the base substrate, and
    a sum of a thickness of the dielectric layer and a thickness of the auxiliary electrode is smaller than a depth of the second opening.

2. The transparent display substrate according to claim 1, wherein
    the reflective anode is located in the light-emitting portion, the organic light-emitting layer is disposed in the first opening, and the transmissive cathode completely covers the pixel region.

3. The transparent display substrate according to claim 1, wherein the dielectric layer and the organic light-emitting layer are formed by a same process from a same material.

4. The transparent display substrate according to claim 1, wherein a ratio of the light-transmitting portion occupied in the pixel region is substantially equal to a ratio of the light-emitting portion occupied in the pixel region.

5. The transparent display substrate according to claim 2, wherein the plurality of pixel regions are arranged in an array along a row direction and a column direction, and
    second openings of all the pixel regions located in a same row or a same column are communicated with each other to form a channel extending in the row direction or the column direction.

6. The transparent display substrate according to claim 1, wherein a material of forming the auxiliary material comprises ionic liquid;
    the ionic liquid comprises at least one selected from the group consisted of quaternary ammonium salt ionic liquid, nitrogen-containing heterocyclic ionic liquid and pyridinium ionic liquid.

7. The transparent display substrate according to claim 6, wherein a carbon chain length of a positive ion in the ionic liquid is equal to 10.

8. The transparent display substrate according to claim 6, wherein the nitrogen-containing heterocyclic ionic liquid comprises imidazole ionic liquid.

9. The transparent display substrate according to claim 1, wherein a thickness of the auxiliary electrode is in a range of about 0.3 μm-about 1 μm.

* * * * *